(12) United States Patent
Huang et al.

(10) Patent No.: US 11,439,001 B2
(45) Date of Patent: Sep. 6, 2022

(54) SYSTEM AND METHOD FOR HEAT REMOVAL USING A THERMAL POTTING SOLUTION IN AN INFORMATION HANDLING SYSTEM

(71) Applicant: DELL PRODUCTS, LP, Round Rock, TX (US)

(72) Inventors: Iris Huang, Taipei (TW); Cliff CH Chuang, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 474 days.

(21) Appl. No.: 16/683,824

(22) Filed: Nov. 14, 2019

(65) Prior Publication Data

US 2021/0153335 A1    May 20, 2021

(51) Int. Cl.
| | | |
|---|---|---|
| *H05K 1/02* | (2006.01) | |
| *G06F 1/16* | (2006.01) | |
| *H05K 1/18* | (2006.01) | |
| *H05K 3/30* | (2006.01) | |
| *H05K 3/28* | (2006.01) | |
| *G06F 1/20* | (2006.01) | |
| *G06F 3/02* | (2006.01) | |
| *H05K 7/20* | (2006.01) | |

(52) U.S. Cl.
CPC ......... *H05K 1/0203* (2013.01); *G06F 1/1662* (2013.01); *G06F 1/203* (2013.01); *G06F 3/0202* (2013.01); *H05K 1/181* (2013.01); *H05K 3/284* (2013.01); *H05K 3/303* (2013.01); *H05K 7/20154* (2013.01); *H05K 7/20172* (2013.01); *H05K 2201/066* (2013.01); *H05K 2201/10522* (2013.01); *H05K 2201/2018* (2013.01); *H05K 2203/1316* (2013.01); *H05K 2203/1327* (2013.01)

(58) Field of Classification Search
CPC ...... H05K 1/0203; H05K 3/284; H05K 3/303; H05K 7/20154; H05K 2201/066; H05K 2201/10522; H05K 2201/2018; H05K 2203/1316; H05K 2203/1327; H05K 7/20463
USPC ......................................................... 361/709
See application file for complete search history.

(56) References Cited

U.S. PATENT DOCUMENTS

| | | | |
|---|---|---|---|
| 2005/0111189 A1* | 5/2005 | Smalc | G06F 1/182 257/722 |
| 2006/0086493 A1* | 4/2006 | Fujiwara | H01L 23/373 165/185 |
| 2006/0120054 A1* | 6/2006 | Buschke | H05K 5/064 361/720 |
| 2013/0081347 A1 | 4/2013 | DeWar et al. | |
| 2018/0199461 A1* | 7/2018 | Huss | H01L 23/295 |

(Continued)

*Primary Examiner* — Sherman Ng
(74) *Attorney, Agent, or Firm* — Larson Newman, LLP

(57) ABSTRACT

An information handling system includes a printed circuit board (PCB), a barrier frame, thermal potting material that fills the barrier frame, and a heat removing structure embedded into the thermal potting material. The barrier frame encloses a first device, and extends to also enclose a second location of the PCB. The thermal potting material surrounds the first device. The heat removing structure includes a first pad co-located with the first device, a second pad co-located with the second location, and a thermally conductive connection between the first pad and the second pad. The heat removing structure may remove heat generated by the first device to the second pad.

14 Claims, 3 Drawing Sheets

(56) References Cited

U.S. PATENT DOCUMENTS

2019/0182965 A1 6/2019 Zhang et al.
2019/0198419 A1* 6/2019 Nguyen ............... G06F 1/1656

* cited by examiner

SYSTEM AND METHOD FOR HEAT REMOVAL USING A THERMAL POTTING SOLUTION IN AN INFORMATION HANDLING SYSTEM

FIELD OF THE DISCLOSURE

This disclosure generally relates to information handling systems, and more particularly relates to heat removal using a thermal potting solution in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a printed circuit board (PCB), a barrier frame, thermal potting material that fills the barrier frame, and a heat removing structure embedded into the thermal potting material. The barrier frame may enclose a first device, and extends to also enclose a second location of the PCB. The thermal potting material may surround the first device. The heat removing structure may include a first pad co-located with the first device, a second pad co-located with the second location, and a thermally conductive connection between the first pad and the second pad. The heat removing structure may remove heat generated by the first device to the second pad.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
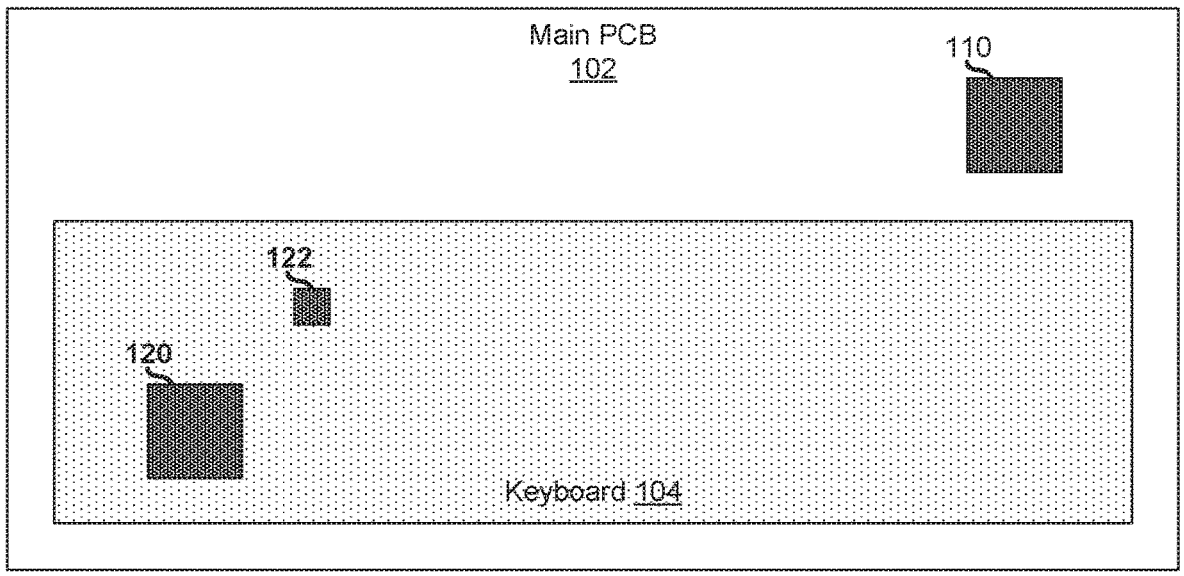
FIGS. 1-5 are block diagrams illustrating an information handling system according to an embodiment of the present disclosure.

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

FIGS. 1-5 show an information handling system 100 that includes a main printed circuit board (PCB) 102 to which are attached heat generating components 110, 120, and 122. Information handling system 100 may be representative of a computer system such as a laptop computer, a notebook computer, or the like. Heat generating components 110, 120, and 122 represent components of information handling system 100 that generate extreme amounts of heat, and may include one or more of graphics processors, central processing units (CPUs), voltage regulator circuits, I/O circuits, memory circuits, and other components as are known in the art to generate extreme amounts of heat. As used herein, extreme amounts of heat may be understood as a greater amount of heat as compared with the heat generated by other components of the information handling system.

In particular, heat generating s 110, 120, and 122 will be understood to create sufficient amounts of heat so as to necessitate separate handling of the heat generated therefrom, while other components of information handling system 100 may be understood to be sufficiently cooled by ambient air circulating in the information handling system. It will be understood that PCB 102 may include one or more additional components that generate extreme amounts of heat, and the teachings of the present invention will be understood to be applicable to one or more heat generating components an information handling system as needed or desired Heat generating component 110 is located in an open area of PCB 102. That is, the head space over heat generating component 110 is the distance between the top surface of the heat generating component and a bottom surface of the case of information handling system 100. On the other hand, heat generating components 120 and 122 are located in an area of the PCB that is under a keyboard 104, and thus the head space over heat generating components 120 and 122 is less than the head space over heat generating component 110 because the head space over heat generating components 120 and 122 is reduced by the thickness of a keyboard 104.

Figure 2:
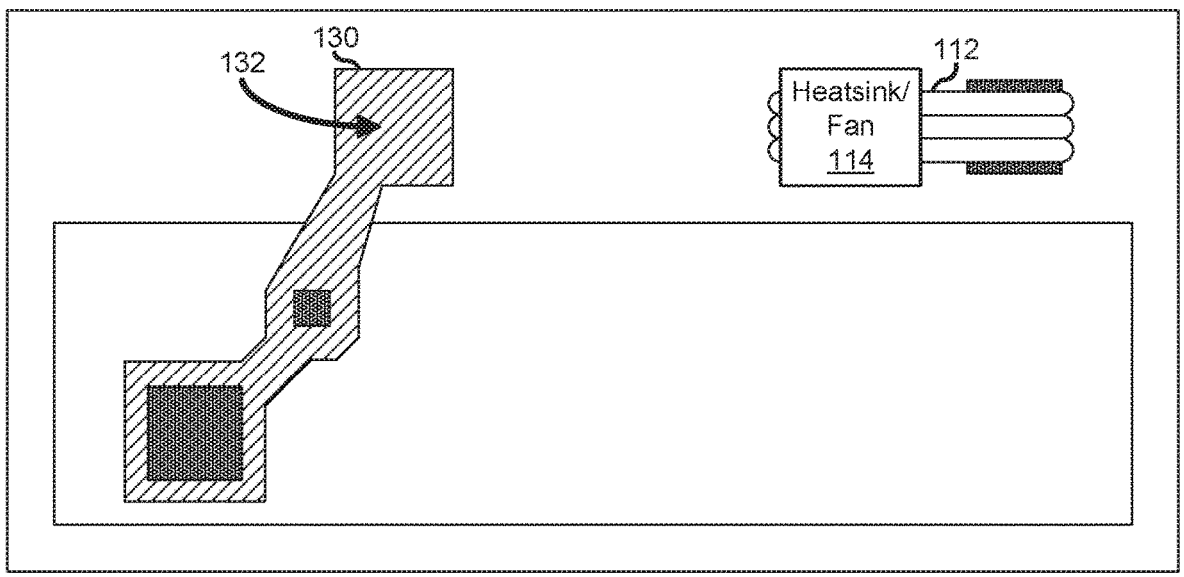

FIG. 2 illustrates information handling system 100 with heat removing apparatus 112 and a fan/heatsink 114 that are both associated with heat generating component 110. Because heat generating component 110 is in an open area of PCB 102, and the head space over the heat generating component is large, conventional cooling methods can be employed to remove the heat from the heat generating component, and to exhaust the heat outside of information handling system 100. As such, heat removing apparatus 112 represents one or more of various types of heat-exchanging apparatuses for removing heat from heat generating component 110. For example, heat removing apparatus 112 may represent one or more of a set of heat pipes, a cooling block with an integrated fin structure, a vapor chamber, or the like that is designed to move the extreme amounts of heat generated by heat generating component 110 to other areas of information handling system 100.

In a typical embodiment, heat removing apparatus 112 represents one or more heat pipes that are thermally attached to the surface or heat generating component 110, and are shaped to accommodate thermal, mechanical, and functional design considerations within information handling system 100, as needed or desired. Fan/heat sink 114 is thermally attached to heat removing apparatuses 112, and operate to move the extreme amounts of heat generated by heat generating component 110 from heat removing apparatus 112, and to blow cooler air across the heat sinks to remove the extreme amounts of heat from information handling system 100. It will be understood that heat removing apparatuses 112 and heat sink/fan 114 may be representative of various heat-exchanging apparatuses such as thermal blocks which remove heat via conductive cooling, heat pipes or vapor chambers which remove heat via a combination of conductive cooling and phase-transition cooling, or other heat-exchanging apparatuses, as needed or desired. The methods and practices of removing heat from heat generating components that are located in open areas of a PCB are known in the art, and will not be further disclosed herein, except as needed to describe the current embodiments.

FIG. 2 further shows a barrier frame 130 that surrounds both heat generating components 120 and 122, and extends out from under keyboard 104 to an open area of PCB 102. Barrier frame 130 provides an enclosed area into which thermal potting material 132 is added to surround heat generating components 120 and 122. Barrier frame 130 may typically represent an electrically non-conductive wall, formed to retain thermal potting material 132 and to keep the thermal potting material from running out onto other components of PCB 102. Barrier frame 130 may be formed of any suitable material, such as a graphite or carbon fiber, a plastic or thermoplastic material, or the like, that can be installed onto PCB 102 and filled with thermal potting material 132, and that can keep the thermal potting material from running onto the other components of PCB 102, as needed or desired. Thermal potting material 132 may include epoxy potting compounds, urethane potting compounds, silicon potting compounds, or the like, and can be modified to improve the thermal conductivity by the addition of, for example alumina, graphite fiber, carbon fiber or the like.

Figure 3:
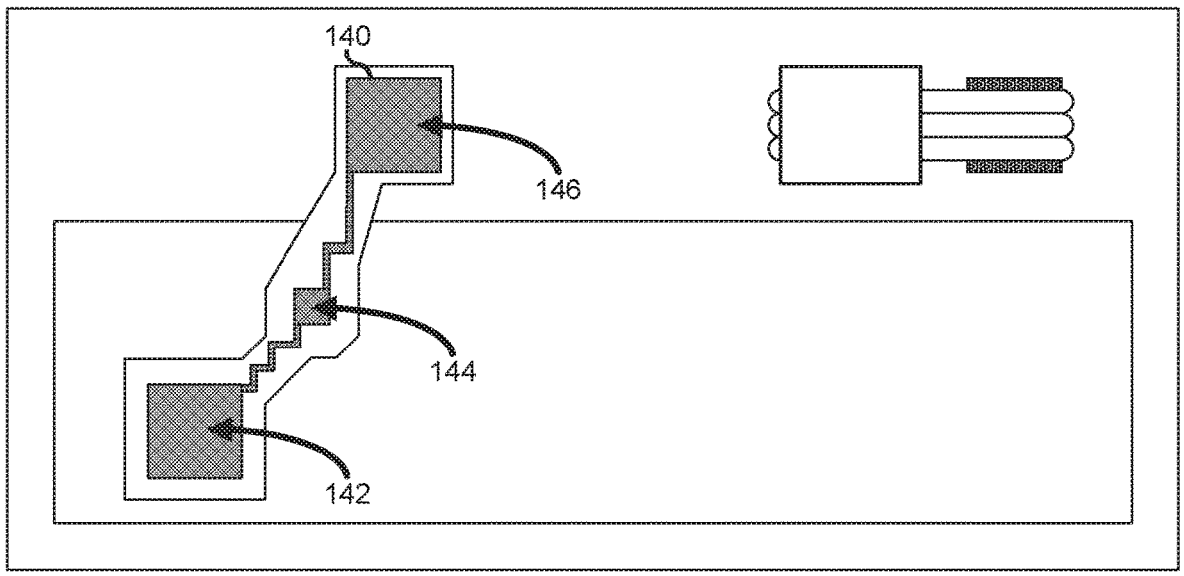

FIG. 3 illustrates information handling system 100 with a heat removing structure 140 embedded into thermal potting material 134 with a pad 142 co-located with heat generating component 120, a pad 144 co-located with heat generating component 122, and with a pad 146 located in the open area of PCB 102. Heat removing structure 140 is configured to receive the excess heat generated at heat generating component 120 via pad 142, to receive the excess heat generated at heat generating component 122 via pad 144, and to transfer the excess heat from pads 142 and 144 to pad 146. As shown, heat removing structure 140 is shown with a zig-zagging portions between pad 142 and pad 144, and with a zig-zagging portion between pad 144 and pad 146. Here, it may be understood that the zig-zagging portions are shaped to route around various other components of PCB 102.

In another embodiment, the portions between pads 142, 144, and 144 may be routed directly between the pads, thereby forming a shortest path for the heat to be conducted from heat generating components 120 and 122 to pad 146. Heat removing structure 140 will be understood to be constructed of a thermally conductive material such as metal, graphite, or the like. In a particular example, heat removing structure 140 is constructed of a sheet of, e.g., bronze, that is folded to form the shape of the heat removing structure, as needed or desired. In a particular embodiment, heat removing structure 140 is embedded into thermal potting material 134 before in a manufacturing step that occurs prior to the curing of the thermal potting material, such that the heat removing structure is embedded into the thermal potting material, and is fixed into place by the curing of the thermal potting material.

Figure 4:
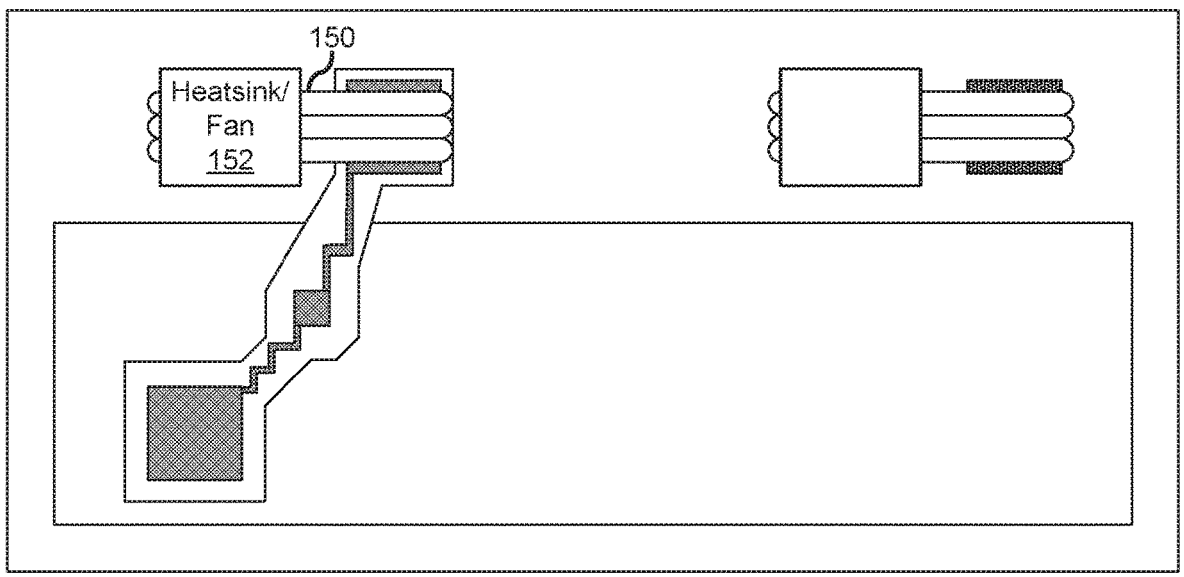

FIG. 4 illustrates information handling system 100 with heat removing apparatus 150 and a fan/heatsink 152 that are both associated with pad 146. Because pad 146 is in an open area of PCB 102, and the head space over the pad is large, conventional cooling methods can be employed to remove the heat from the pad, and to exhaust the heat outside of information handling system 100. As such, heat removing apparatus 150 is similar to heat removing apparatus 112 and may represents the same type of heat-exchanging apparatuses for removing heat from pad 146, or may represent a different type of heat-exchanging apparatus. For example, heat removing apparatus 150 may represent one or more of a set of heat pipes, a cooling block with an integrated fin structure, a vapor chamber, or the like that is designed to move the extreme amounts of heat generated by heat generating components 120 and 122 to other areas of information handling system 100.

In a typical embodiment, heat removing apparatus 150 represents one or more heat pipes that are thermally attached to the surface or pad 146, and are shaped to accommodate thermal, mechanical, and functional design considerations within information handling system 100, as needed or desired. Fan/heat sink 152 is thermally attached to heat removing apparatuses 150, and operates to move the extreme amounts of heat generated by heat generating components 120 and 122 from heat removing apparatus 150, and to blow cooler air across the heat sink to remove the extreme amounts of heat from information handling system 100. Heat removing apparatuses 150 and heat sink/fan 152 may be representative of various heat-exchanging apparatuses such as thermal blocks which remove heat via conductive cooling, heat pipes or vapor chambers which remove heat via a combination of conductive cooling and phase-transition cooling, or other heat-exchanging apparatuses, as needed or desired. It will be understood that, prior to the attaching of heat removing apparatus 150 to pad 146, additional thermal potting material 132 may be added within barrier frame 130, as needed or desired. In a particular embodiment, the added thermal potting material 132 is formed as fins which operate to dissipate the extreme amount of heat from heat generating components 120 and 122, as needed or desired.

Figure 5:
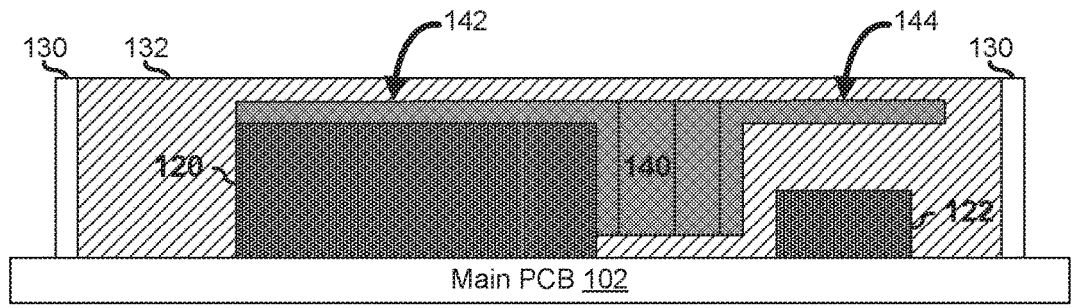

FIG. 5 illustrates a side view of a portion of information handling system 100. In a particular embodiment, as illustrated, pad 142 is thermally affixed to heat generating component 120. Here, it will be understood that a heat removing structure may be thermally affixed to heat generating components, as needed or desired. In particular, thermally affixing a heat removing structure to a heat generating component may be advantageous where the heat generating component emits heat via a flat surface, such as where the heat generating component is a processor die or the like. Further, as illustrated, pad 144 is not thermally affixed to heat generating component 122. Here, it will be further understood that a heat removing structure may not be thermally affixed to a different heat generating component, as needed or desired. In particular, not thermally affixing a heat removing structure to a heat generating component may be advantageous where the heat generating component has an irregular shape, such as a choke in a voltage regulator, a resistor, or another irregularly shaped component.

More so, such an irregularly shaped component may not radiate heat in any particular direction. Thus, here, the inclusion of thermal potting material provides for greater contact with the heat generating component, and greater transmission of the heat into the heat removing structure. It will be understood that FIGS. 1-5 may represent an assembly method for information handling system 100, where heat generating components 110, 120, and 122 are attached to PCB 102, as shown in FIG. 1, heat removing apparatus 112 and heat sink/fan 114 are attached to heat generating component 110, and barrier frame 130 is installed onto PCB 102, and the barrier frame is filled with thermal potting material 132, as shown in FIG. 2, heat removing structure 130 is embedded into the thermal potting material, as shown in FIG. 3, and heat removing apparatus 150 and heat sink/fan 152 are attached to pad 146, as shown in FIG. 4, and where a portion of the final assembly is shown in FIG. 5.

Figure 6:
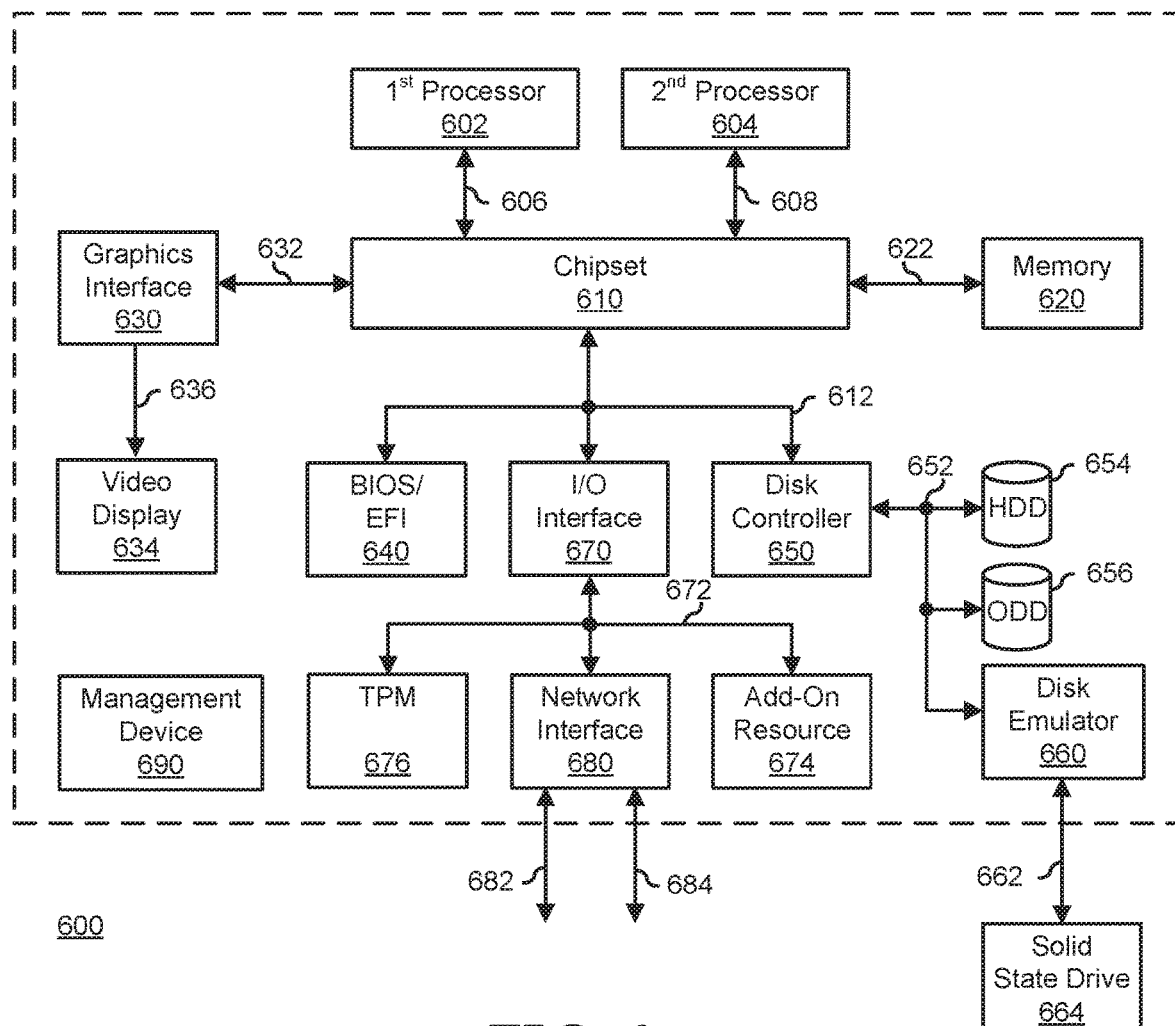
FIG. 6 is a block diagram illustrating an information handling system according to another embodiment of the present disclosure.

FIG. 6 illustrates a generalized embodiment of an information handling system 600 similar to information handling system 100. For purpose of this disclosure information handling system 800 can be configured to provide the features and to perform the functions of the OPF system as described herein. Information handling system 800 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price.

Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes a processors 602 and 604, a chipset 610, a memory 620, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an input/output (I/O) interface 670, one or more add-on resources 674, a trusted platform module (TPM) 676, a network interface 680, a management device 690, and a power supply 695. Processors 602 and 604, chipset 610, memory 620, graphics interface 630, BIOS/UEFI module 640, disk controller 650, HDD 654, ODD 656, disk emulator 660, SSD 662, I/O interface 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to chipset 610 via processor interface 606, and processor 604 is connected to the chipset via processor interface 608. Memory 620 is connected to chipset 610 via a memory bus 622. Graphics interface 630 is connected to chipset 610 via a graphics interface 632, and provides a video display output 636 to a video display 634. In a particular embodiment, information handling system 600 includes separate memories that are dedicated to each of processors 602 and 604 via separate memory interfaces. An example of memory 620 includes random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O interface 670 are connected to chipset 610 via an I/O channel 612. An example of I/O channel 612 includes a Peripheral Component Interconnect (PCI) interface, a PCI-Extended (PCI-X) interface, a high speed PCI-Express (PCIe) interface, another industry standard or proprietary communication interface, or a combination thereof. Chipset 610 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O interface 670 includes a peripheral interface 672 that connects the I/O interface to add-on resource 674, to TPM 676, and to network interface 680. Peripheral interface 672 can be the same type of interface as I/O channel 612, or can be a different type of interface. As such, I/O interface 670 extends the capacity of I/O channel 612 when peripheral interface 672 and the I/O channel are of the same type, and the I/O interface translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as chipset 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600.

Management device 690 can operate off of a separate power plane from the components of the host environment so that the management device receives power to manage information handling system 600 when the information handling system is otherwise shut down. An example of management device 690 may include a commercially available BMC product that operates in accordance with an Intelligent Platform Management Initiative (IPMI) specification, such as a Integrated Dell Remote Access Controller (iDRAC), or the like. Management device 690 may further include associated memory devices, logic devices, security devices, or the like, as needed or desired.

Power supply 695 represents one or more devices for power distribution to the components of information handling system 600. In particular, power supply 695 can include a main power supply that receives power from an input power source, such as a wall power outlet, a power strip, a battery, or another power source, as needed or desired. Here, power source 695 operates to convert the power at a first voltage level from the input power source to one or more power rails that are utilized by the components of information handling system. Power supply 695 can also include one or more voltage regulators (VRs) that each receive power from the main power supply and that operate to convert the input voltage to an output voltage that is used by one or more components of information handling system. For example, a VR can be provided for each of processors 602 and 604, and another VR can be provided for memory 620. Power supply 695 can be configured to provide a first power plane that provides power to the host environment, and to provide a second power plane that provides power to the management environment.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising: a printed circuit board (PCB) including a first device at a first location of the PCB; a barrier frame that encloses the first device, and that extends to also enclose a second location of the PCB; thermal potting material that fills the barrier frame, and that surrounds the first device; a heat removing structure embedded into the thermal potting material, the heat removing structure including a first pad co-located with the first device, a second pad co-located with the second location, and a thermally conductive connection between the first pad and the second pad, the heat removing structure to remove heat generated by the first device to the second pad; a keyboard situated above the PCB, wherein the first location is under the keyboard, and wherein the second location is not under the keyboard; a heat removing apparatus thermally attached to the second pad; and a heat sink thermally attached to the heat removing apparatus.

2. The information handling system of claim 1, wherein: the PCB further includes a second device at a third location of the PCB; the barrier frame further encloses the second device; the thermal potting material further surrounds the second device; and the heat removing structure further includes a third pad co-located with the second device, wherein the thermally conductive connection is further between the first and second pads, and the third pad, the heat removing structure further to remove heat generated by the second device to the second pad.

3. The information handling system of claim 1, where in the barrier frame comprises an electrically non-conductive wall formed to retain the thermal potting material.

4. The information handling system of claim 3, wherein the barrier frame is formed of one of a graphite fiber, a carbon fiber, a plastic material, and a thermoplastic material.

5. The information handling system of claim 1, wherein the thermal potting material includes one of an epoxy potting compound, a urethane potting compound, and a silicon potting compounds.

6. The information handling system of claim 5, wherein the thermal potting material includes one of alumina, graphite fiber, and carbon fiber.

7. The information handling system of claim 1, wherein the heat removing structure is constructed of one of a metal and graphite.

8. A method, comprising: attaching a first device at a first location of a printed circuit board (PCB); installing a barrier frame to the PCB, wherein the barrier frame encloses the first device and extends to also enclose a second location of the PCB; filling the barrier frame with thermal potting material, the thermal potting material surrounding the first device; embedding into the thermal potting material a heat removing structure, the heat removing structure including a first pad co-located with the first device, a second pad co-located with the second location, and a thermally conductive connection between the first pad and the second pad; wherein heat generated by the first device may be removed to the second pad via the heat removing structure; providing a keyboard situated above the PCB, wherein the first location is under the keyboard, and wherein the second location is not under the keyboard; thermally attaching a heat removing apparatus thermally to the second pad; and thermally attaching a heat sink to the heat removing apparatus.

9. The method of claim 8, further comprising: attaching a second device at a third location of the PCB, wherein the barrier frame further encloses the second device, the thermal potting material further surrounds the second device, and the heat removing structure further includes a third pad co-located with the second device, wherein the thermally conductive connection is further between the first and second pads, and the third pad, the heat removing structure further to remove heat generated by the second device to the second pad.

10. The method of claim 8, where in the barrier frame comprises an electrically non-conductive wall formed to retain the thermal potting material, and is formed of one of a graphite fiber, a carbon fiber, a plastic material, and a thermoplastic material.

11. The method of claim 8, wherein the thermal potting material includes one of an epoxy potting compound, a urethane potting compound, and a silicon potting compounds.

12. The method of claim 11, wherein the thermal potting material includes one of alumina, graphite fiber, and carbon fiber.

13. The method of claim 8, wherein the heat removing structure is constructed of one of a metal and graphite.

14. An information handling system, comprising: a printed circuit board (PCB) including a first device at a first location of the PCB, and a second device at a second location of the PCB; a keyboard situated above the PCB, wherein the first location is under the keyboard, and wherein the second location is not under the keyboard; a barrier frame that encloses the first device, and that extends to also enclose a third location of the PCB, wherein the third location is not under the keyboard; thermal potting material filling that fills the barrier frame, and that surrounds the first device; a heat removing structure embedded into the thermal potting material, the heat removing structure including a first pad co-located with the first device, a second pad co-located with the third location, and a thermally conductive connection between the first pad and the second pad, the heat removing structure to remove heat generated by the first device to the second pad; a first heat removing apparatus thermally attached to the second pad; a first heat sink thermally attached to the first heat removing apparatus; a second heat removing apparatus thermally attached to the second device; and a second heat sink thermally attached to the second heat removing apparatus.

\* \* \* \* \*